(12) United States Patent
He

(10) Patent No.: US 11,309,407 B2
(45) Date of Patent: Apr. 19, 2022

(54) METHODS OF MANUFACTURING LOW-TEMPERATURE POLYSILICON THIN FILM AND TRANSISTOR

(71) Applicant: HKC CORPORATION LIMITED, Guangdong (CN)

(72) Inventor: Huailiang He, Chongqing (CN)

(73) Assignee: HKC CORPORATION LIMITED, Shenzhen (CN)

( * ) Notice: Subject to any disclaimer, the term of this patent is extended or adjusted under 35 U.S.C. 154(b) by 240 days.

(21) Appl. No.: 16/760,068

(22) PCT Filed: Nov. 14, 2017

(86) PCT No.: PCT/CN2017/110824
§ 371 (c)(1),
(2) Date: Apr. 29, 2020

(87) PCT Pub. No.: WO2019/085011
PCT Pub. Date: May 9, 2019

(65) Prior Publication Data
US 2021/0074831 A1 Mar. 11, 2021

(30) Foreign Application Priority Data

Nov. 3, 2017 (CN) .......................... 201711070813.8

(51) Int. Cl.
*H01L 21/00* (2006.01)
*H01L 29/66* (2006.01)
*H01L 21/02* (2006.01)

(52) U.S. Cl.
CPC .. *H01L 29/66765* (2013.01); *H01L 21/02675* (2013.01)

(58) Field of Classification Search
CPC ................... H01L 29/66765; H01L 21/02675
See application file for complete search history.

(56) References Cited

U.S. PATENT DOCUMENTS 11,205,712 B2 * 12/2021 He .................... H01L 29/78696
2009/0146264 A1 6/2009 Yang

FOREIGN PATENT DOCUMENTS

CN 1638042 A 7/2005
CN 1728403 A 2/2006
(Continued)

*Primary Examiner* — Richard A Booth
(74) *Attorney, Agent, or Firm* — Muncy, Geissler, Olds & Lowe, PC

(57) ABSTRACT

A method of manufacturing a low temperature polysilicon thin film includes: forming a buffer layer on a substrate; forming a gate electrode on the buffer layer; forming a patterned raising layer on the gate electrode, wherein the patterned raising layer covers a top surface and a lateral surface of the gate electrode; forming a first diffusion barrier layer on the patterned raising layer; forming a second diffusion barrier layer on the first diffusion barrier layer; forming a silicon layer on the second diffusion barrier layer; annealing the silicon layer to form a polysilicon layer, wherein the polysilicon layer includes a patterned area and a to-be-removed area, the patterned area has the same pattern with the patterned raising layer, and the patterned area is whole directly above the patterned raising layer; and in the polysilicon layer, removing the to-be-removed area, and keeping the patterned area.

20 Claims, 6 Drawing Sheets

(56) References Cited

FOREIGN PATENT DOCUMENTS

| CN | 100339756 C | 9/2007 |
|---|---|---|
| CN | 102629558 A | 8/2012 |
| CN | 102655115 A | 9/2012 |
| CN | 103531640 A | 1/2014 |
| CN | 103765597 A | 4/2014 |
| CN | 103887244 A | 6/2014 |
| CN | 1530719 A | 9/2014 |
| CN | 106847824 A | 6/2017 |
| CN | 107887275 A | 4/2018 |
| CN | 107919270 A | 4/2018 |

* cited by examiner

METHODS OF MANUFACTURING LOW-TEMPERATURE POLYSILICON THIN FILM AND TRANSISTOR

BACKGROUND

Technology Field

This disclosure relates to methods of manufacturing a silicon thin film and a transistor, and more particularly to methods of manufacturing a low temperature polysilicon thin film and a transistor.

Description of Related Art

Flat panel displays have been widely used in various fields. The liquid crystal display device has superior advantages including compact, low power consumption and radiationless, so it has been gradually replaced the conventional cathode ray tube display device, and it is applied to various electronic products, such as mobile phone, portable multimedia device, notebook computer, liquid crystal television, liquid crystal monitor, etc.

The liquid crystal display device includes a display panel. At present, an active matrix type liquid crystal display panel is most general display panel, which includes an active matrix substrate, an opposite substrate, and a liquid crystal layer interposed between the two substrates. The active matrix substrate has a plurality of row conductors, column conductors and pixels, the pixels have pixel driving elements, and the pixel driving elements are connected to the row conductors and the column conductors. The pixel driving element is generally a thin film transistor, and the row conductors and the column conductors are usually metal conductors.

Thin film transistors of an active matrix substrate may be conventional amorphous silicon thin film transistors or low temperature polysilicon thin film transistors having better electric conductivity. In low temperature polysilicon process, excimer laser annealing is utilized and the excimer laser is used as a heat source. The laser beam irradiates the amorphous silicon thin film to make the amorphous silicon recrystallize and transform into polysilicon structure. Because the whole process is completed below 600° C., general glass substrate is applicable. However, in laser annealing, not only the silicon film is heated, and the glass substrate below the silicon film also absorbs heat so its temperature raises. Accordingly, the impurities in the glass substrate diffuse into the silicon film and degrade semiconductor characteristic of the silicon film.

SUMMARY

In view of the deficiencies of the prior art, the inventor has obtained this disclosure after the research and development have been made. An objective of this disclosure is to provide methods of manufacturing a low temperature polysilicon thin film and a transistor, which can alleviate diffusion of the substrate impurity in the silicon film.

This disclosure provides a method of manufacturing a low temperature polysilicon thin film, comprising: forming a buffer layer on a substrate; forming a gate electrode on the buffer layer; forming a patterned raising layer on the gate electrode, wherein the patterned raising layer covers a top surface and a lateral surface of the gate electrode; forming a first diffusion barrier layer on the patterned raising layer; forming a second diffusion barrier layer on the first diffusion barrier layer; forming a silicon layer on the second diffusion barrier layer; annealing the silicon layer to form a polysilicon layer, wherein the polysilicon layer includes a patterned area and a to-be-removed area, the patterned area has the same pattern with the patterned raising layer, and the patterned area is whole directly above the patterned raising layer; and in the polysilicon layer, removing the to-be-removed area, and keeping the patterned area.

In one embodiment, the patterned area includes a center part and two side parts. The center part is between the side parts, and the center part is directly above the gate electrode. The side parts are not directly above the gate electrode.

In one embodiment, the method further comprises: generating defects on an upper surface of the first diffusion barrier layer.

In one embodiment, the method further comprises: generating defects on an upper surface of the buffer layer.

In one embodiment, the method further comprises: before forming the second diffusion barrier layer, forming an impurity collection layer on the first diffusion barrier layer and then forming the second diffusion barrier layer on the impurity collection layer.

In one embodiment, the method further comprises: before annealing, forming an impurity collection layer on the silicon layer.

In one embodiment, the impurity collection layer is a low density porous $SiO_x$ layer.

In one embodiment, pores of the impurity trap functions as a recrystallization growth space.

In one embodiment, the buffer layer comprises a plurality of sub-buffer layers.

In one embodiment, the uppermost one of the sub-buffer layers has pores, and the pores function as recrystallization grown space.

In one embodiment, the method further includes: before annealing, defining a pattern on the silicon layer, wherein the pattern is left with recrystallization growth space.

In one embodiment, the recrystallization growth space is located on the lateral side of the pattern.

In one embodiment, the method further includes: roughening a surface of the second silicon layer to form a recrystallization growth space.

In one embodiment, the annealing is laser annealing.

This disclosure provides a method of manufacturing a low temperature polysilicon thin film, comprising: the steps of the method of manufacturing the low temperature polysilicon thin film as mentioned above; and forming a source electrode and a drain electrode, wherein the source electrode and the drain electrode are electrically connected to the polysilicon layer.

In summary, bottom gate configuration is utilized in the method of manufacturing a low temperature polysilicon thin film, and multiple diffusion barrier layers are utilized in the gate insulation layer above the gate electrode. Thus, the gate electrode can block the substrate impurities from diffusing into the silicon layer, and the multiple diffusion barrier layers also block the substrate impurities from diffusing into the silicon layer. The polysilicon film can have acceptable semiconductor characteristic In addition, because the methods of manufacturing the low temperature polysilicon thin film and the transistor provide the amorphous silicon with the recrystallization growth space, the squeeze between the crystals can be eased in the amorphous silicon recrystallization process, and thus the sizes of the protrusions of the surface of the polysilicon layer are significantly smaller. In one case, the aspect ratio of the protrusions is smaller than 0.3 and even smaller than 0.2. Thus, the protruding problem on the surface of the low temperature polysilicon thin film can be improved.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

Figure 1A:
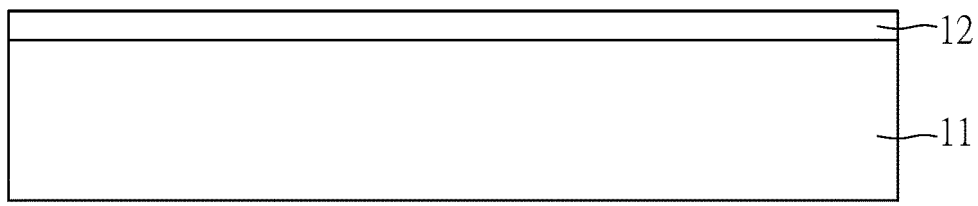
FIGS. 1A to 1D are schematic views showing an embodiment of method of manufacturing a low temperature polysilicon thin film.

Specific structures and function details disclosed herein are only for the illustrative purpose for describing the exemplary embodiment of this disclosure. However, this disclosure can be specifically implemented through many replacements, and should not be explained as being restricted to only the embodiment disclosed herein.

In the description of this disclosure, it is to be understood that the terms "center", "transversal", "up", "down", "left", "right", "vertical", "horizontal", "top", "bottom", "inside" and "outside" indicating the orientation or position relationships are the orientation or position relationships based on the drawing, are only provided for the purposes of describing this disclosure and simplifying the description, but do not indicate or imply that the directed devices or elements must have the specific orientations or be constructed and operated in the specific orientations, and thus cannot be understood as the restriction to this disclosure. In addition, the terms "first", and "second" are used for the illustrative purpose only and cannot be understood as indicating or implying the relative importance or implicitly specifying the number of indicated technical features. Therefore, the features restricted by "first" and "second" may expressly or implicitly comprise one or a plurality of ones of the features. In the description of this disclosure, unless otherwise described, the meaning of "a plurality of" comprises two or more than two. In addition, the terms "comprises" and any modification thereof intend to cover the non-exclusive inclusions.

In the description of this disclosure, it needs to be described that, unless otherwise expressly stated and limited, the terms "mount", "link" and "connect" should be broadly understood. For example, they may be the fixed connection, may be the detachable connection or may be the integral connection; may be the mechanical connection or may also be the electrical connection; or may be the direct connection, may be the indirect connection through a middle medium or may be the inner communication between two elements. It will be apparent to those skilled in the art that the specific meanings of the above terms in this application may be understood according to the specific conditions.

The terms used herein are for the purpose of describing only specific embodiments and are not intended to limit the exemplary embodiments. Unless the contexts clearly indicate otherwise, the singular form "one", "a" and "an" used here further intend to include plural forms. It should also be understood that the terms "comprising" and/or "including" are used herein to describe the features to describe the presence of stated features, integers, steps, operations, units and/or elements without excluding the presence or addition of one or more other features, integers, steps, operations, units, elements, and/or combinations thereof.

This disclosure will be further described below with reference to the accompanying drawings and preferred embodiments.

FIGS. 1A to 1D are schematic views showing an embodiment of method of manufacturing a low temperature polysilicon thin film. As shown in FIG. 1A, the method of manufacturing a low temperature polysilicon thin film includes providing a substrate 11. For example, the substrate 11 is a transparent insulation substrate which may be formed from glass, quartz, or similar materials. Then, a buffer layer 12 is formed on the substrate 11. The buffer layer 12 can be deposited by CVD (chemical vapor deposition) or sputtering. The buffer layer 12 may be formed from $SiN_x$, $SiO_x$ or $SiO_xN_y$, etc.

Figure 1B:
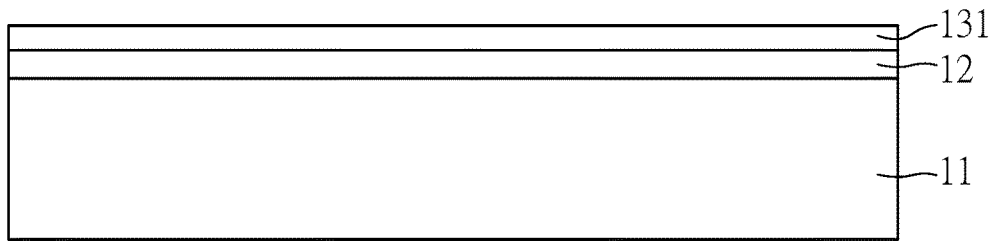
Figure 1C:
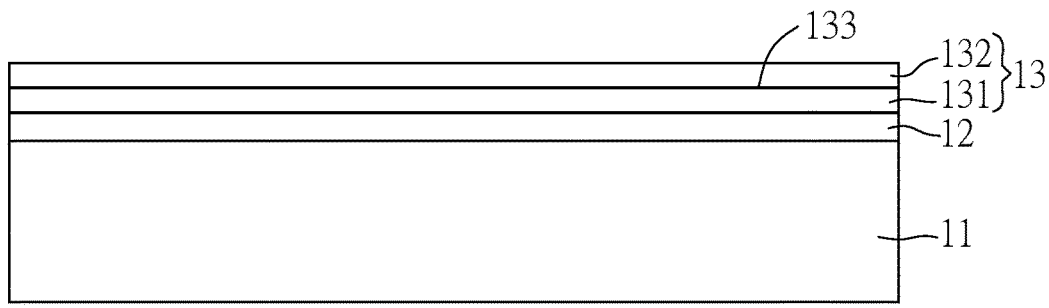

As shown in FIG. 1B, a first silicon layer 131 is formed on the buffer layer 12. The first silicon layer 131 may be deposited on the buffer layer 12 by using conventional deposition method. The material of the first silicon layer is amorphous silicon As shown in FIG. 1C, a second silicon layer 132 is formed on the first silicon layer 131, and a substrate impurity barrier interface 130 is formed between the first silicon layer 131 and the second silicon layer 132. The second silicon layer 132 may be deposited on the first silicon layer 131 by using conventional deposition method. The material of the second silicon layer 132 is amorphous silicon. The second silicon layer 132 is thicker than the first silicon layer 131. The silicon layer 13 includes the first silicon layer 131 and the second silicon layer 132.

For example, the first silicon layer 131 and the second silicon layer 132 are discontinuously deposited. After continuous deposition of the first silicon layer 131 is finished and a time interval later, the second silicon layer 132 is then deposited. A dislocation is generated between the first silicon layer 131 and the second silicon layer 132 as the substrate impurity barrier interface 130.

Moreover, the manufacturing method further includes: before forming or depositing the second silicon layer 132 in FIG. 1B, roughening a surface of the first silicon layer 131 to form the substrate impurity barrier interface 133. Then like FIG. 1C, the second silicon layer 132 is formed or deposited on the roughened surface of the first silicon layer 131, and the substrate impurity barrier interface 133 is formed. The roughened surface of the first silicon layer 131 acts as the substrate impurity barrier interface 133. The roughened surface is an uneven surface. The surface of the first silicon layer 131 is roughened by etching the surface of the first silicon layer 131. For example, the surface roughness of the roughened surface is between 5 nm and 30 nm.

Roughening may include etching, etching may be dry etching or wet etching, the process parameters of the dry etching include frequency, pneumatic, ion density, etch time and the like, and the process parameters of the wet etching include the solution concentration, etch time, reaction temperature, stirring of the solution and the like. The etched surface may have different roughness by adjusting the etch parameters.

The mask pattern transfer is not needed in the process of the roughening, the photoresist needs not to be disposed on the buffer layer, and the mask and exposure are also not needed.

Figure 1D:
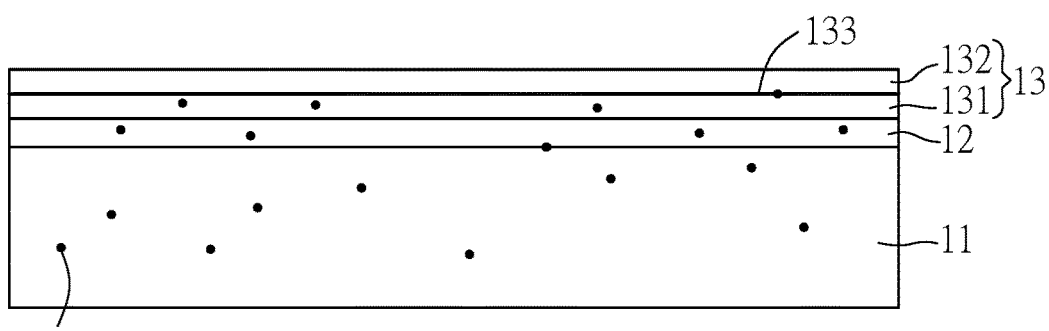

As shown in FIG. 1D, after the amorphous silicon layer 13 is formed, the annealing is performed on the first silicon layer 131 and the second silicon layer 132 to form a polysilicon layer 13. After annealing, in the polysilicon layer 13, the impurity concentration of the second silicon layer 132 is lower than the impurity concentration of the first silicon layer 131.

The annealing is, for example, laser annealing, the annealing process temperature is below 600 degrees Celsius, and the polysilicon thin film obtained using this process may be called as the low temperature polysilicon (referred to as LTPS). Compared with the process temperature up to 1000 degrees Celsius of the early polysilicon thin film, the process temperature of the low temperature polysilicon is lower. Therefore, the material of the substrate is less restricted. For example, a glass substrate may be used as the substrate 11.

The manufacture of the polysilicon layer 13 transforms the original amorphous silicon layer into a polysilicon layer by the annealing process, such as the laser crystallization or the excimer laser annealing (referred to as ELA) and the like.

Figure 2:
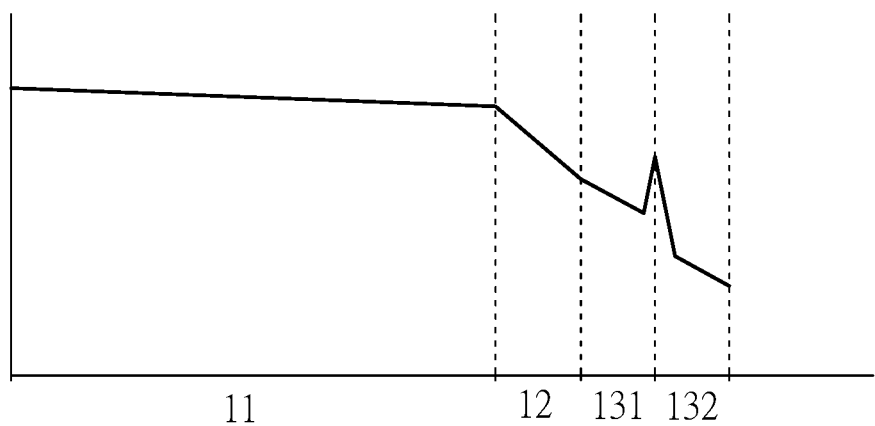
FIG. 2 is a schematic view showing the concentration distribution of the impurities.

Although the impurities of the substrate 11 still diffuse in the annealing and recrystalling, the substrate impurity barrier interface 133 between the first silicon layer 131 and the second silicon layer 132 can block the impurities of the substrate 11 from diffunig into the second silicon layer 132 which is upper layer. The concentration distribution of the impurities is shown in FIG. 2. In one case, most impurities in the silicon layer 13 diffuse into the first silicon layer 131 which is lower layer. In addition, the second silicon layer 132 is thicker than the first silicon layer 131, so the whole polysilicon layer 13 still have acceptable semiconductor characteristic even if the first silicon layer 131 contain most impurities.

In the annealing process, amorphous silicon in the silicon layer 13 is melted and then recrystallized and rearranged to become polysilicon and thus to form the polysilicon layer 13, a plurality of protrusions are formed on the surface of the polysilicon layer 13, and the protrusions may be formed on the upper surface or the lower surface of the polysilicon layer 13.

As the amorphous silicon is recrystallized, a portion of the amorphous silicon firstly functions as the recrystallized seeds, and then grows into larger crystals, and these crystals continuously grow and are combined to form the larger crystals. However, in the combining process, because the stresses of the crystals interact with one another, a portion of the crystals is pushed onto the surface of the polysilicon layer 13 to form protrusions.

To reduce the aspect ratio of the protrusions, pores for the recrystallization protrusions are left near the silicon layer 13. For example, the surface of the buffer layer 12 in FIG. 1A can have pores for the recrystallization protrusions. Before forming the silicon layer on the buffer layer 12, the manufacturing method can include: roughening the buffer layer 12 to form the pores on the surface of the buffer layer 12.

After the first silicon layer 131 in FIG. 1B is formed on the surface of the buffer layer 12, the pores of the buffer layer 12 still have the space not filled with the material of the first silicon layer 131. Then, the silicon layer 13 in FIG. 1D is annealed to form the polysilicon layer 13. The pores are filled with a partial silicon material of the first silicon layer 131 of the polysilicon layer 13.

Since the buffer layer 12 leaves the pores for the recrystallization protrusions, at least the protrusions on the lower surface of the polysilicon layer 13 may be filled into the pores. The pore also constrains the size and the shape of the protrusion to prevent the protrusion from getting oversized. Although protrusions (not shown) are also formed on the upper surface of the polysilicon layer 13, the protruding situations on the upper surface are improved since the portion of the protrusions is changed to the lower surface of the polysilicon layer 13. The aspect ratio of the protrusions of the polysilicon layer of the conventional process is about 0.45, and compared with the conventional process, the aspect ratio of the protrusions of the polysilicon layer 13 can be reduced to be smaller than 0.3, and can even be reduced to be smaller than 0.2. Although there are protrusions on the upper and lower surfaces of the polysilicon layer 13, the aspect ratios of the protrusions are not too large to affect the performance of elements.

Because the method of manufacturing the low temperature polysilicon thin film provides the amorphous silicon with the recrystallization growth space, the squeeze between the crystals can be eased in the amorphous silicon recrystallization process, and thus the sizes of the protrusions of the surface of the polysilicon layer are significantly smaller. In one case, the aspect ratio of the protrusions is smaller than 0.3 and even smaller than 0.2. Thus, the protruding problem on the surface of the low temperature polysilicon thin film can be improved.

Figure 1E:
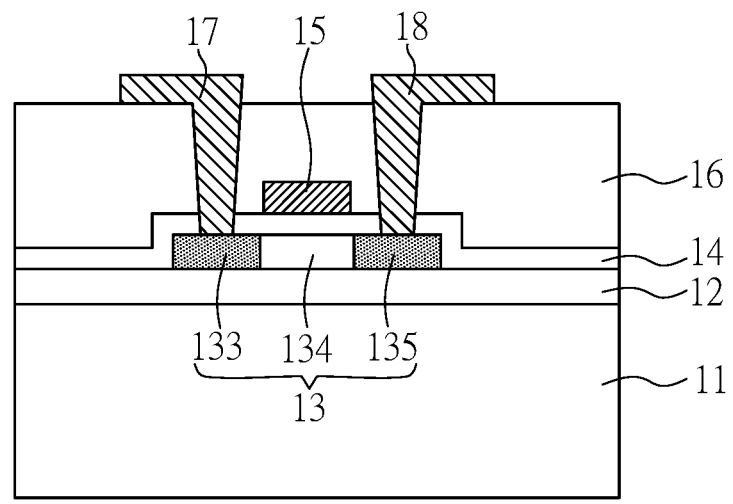
FIG. 1E is a schematic view showing an embodiment of method of manufacturing a low temperature polysilicon thin film transistor.

FIG. 1E is a schematic view showing an embodiment of method of manufacturing a low temperature polysilicon thin film transistor. As shown in FIG. 1E, after forming the polysilicon layer 13 on the substrate 11 as shown in FIG. 1D, the subsequent process is performed to form a thin film transistor. The method of manufacturing a low temperature polysilicon thin film transistor includes: forming a gate insulating layer 14 on the polysilicon layer 13; and forming a gate 15 on the gate insulating layer 14; and forming a source electrode 17 and a drain electrode 18, wherein the source electrode 17 and the drain electrode 18 are electrically connected to the polysilicon layer 13.

For example, the low temperature polysilicon thin film transistor includes the polysilicon layer 14, the gate insulating layer 15, the gate 16, a dielectric layer 17, the source electrode 18 and the drain electrode 19. The polysilicon layer 14 is firstly patterned and the patterned polysilicon layer 14 includes three areas including a source 141, a drain 143 and a trench area 142, and the trench area 142 is located between the source 141 and the drain 143. Then, the gate insulating layer 15 is formed above the patterned polysilicon layer 14 and the substrate 11, wherein the material of the gate insulating layer 15 is, for example, silicon oxide or silicon nitride. Next, the gate 16 is formed above the gate insulating layer 15 and the trench area 142. Then, a dielectric layer 17 is formed on the gate 16 and the gate insulating layer 15, the dielectric layer 17 and the gate insulating layer 15 are patterned to form through holes, and the through holes may expose the source 141 and the drain 143. Then, the source electrode 18 and the drain electrode 19 are formed on the surface of the dielectric layer 17 and the through holes, the source electrode 18 passes through the through hole to contact the source 141, and the drain electrode 19 passes through the through hole to contact the drain 143. Therefore, the source electrode 18 and the drain electrode 19 are electrically connected to the source 141 and the drain 143 of the polysilicon layer 14, respectively.

In addition, the low temperature polysilicon thin film transistor is not limited to the use in a liquid crystal display panel or an organic light emitter diode panel.

Figure 3A:
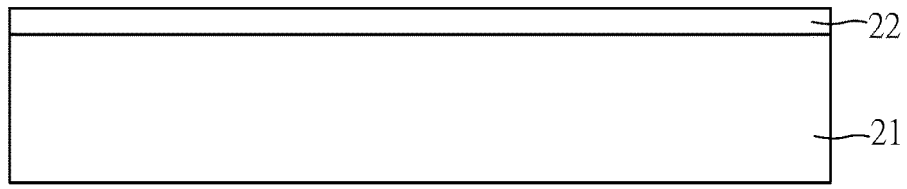
FIGS. 3A to 3G are schematic views showing an embodiment of method of manufacturing a low temperature polysilicon thin film.

FIGS. 3A to 3G are schematic views showing an embodiment of method of manufacturing a low temperature polysilicon thin film. As shown in FIG. 3A, the method of manufacturing a low temperature polysilicon thin film includes providing a substrate 21. For example, the substrate 21 is a transparent insulation substrate which may be formed from glass, quartz, or similar materials. Then, a buffer layer 22 is formed on the substrate 21. The buffer layer 22 can be deposited by CVD (chemical vapor deposition) or sputtering. The buffer layer 22 may be formed from $SiN_x$, $SiO_x$ or $SiO_xN_y$ etc.

Figure 3B:
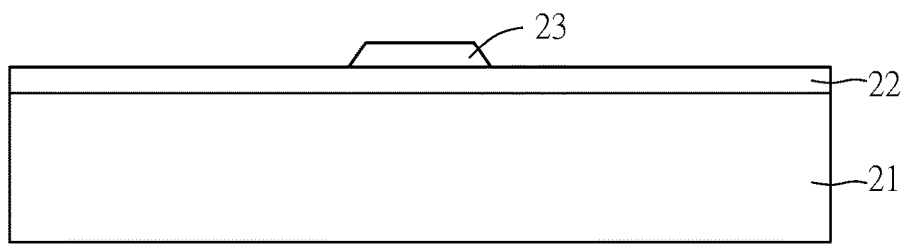

As shown in FIG. 3B, a gate electrode 23 is formed on the buffer layer 22. For example, a metal layer is deposited on the buffer layer 22, and then the metal layer is patterned to form the gate electrode 23. The pattern on the metal layer is transferred through a mask pattern transfer process. For example, an entire layer of photoresist is firstly deposited on an unpatterned metal layer, then the photoresist is exposed by the mask, and the mask pattern is transferred to the photoresist firstly. Then, the etching process is used to etch the metal layer, which is not protected by the photoresist, so that the mask pattern (patterns of gate electrode and circuit line) is transferred to the metal layer.

Figure 3C:
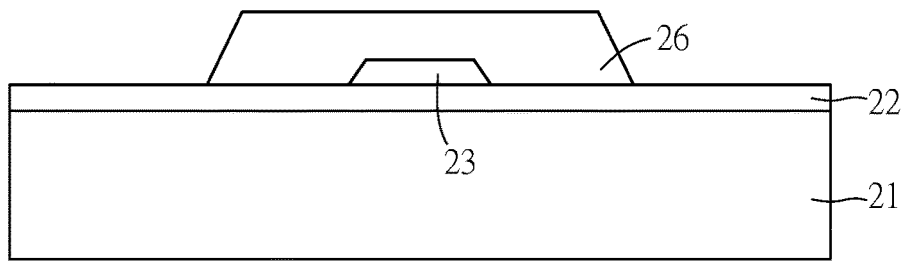

As shown in FIG. 3C, a patterned raising layer 26 is formed on the gate electrode 23. The pattern of the patterned raising layer 26 is the same with the pattern of the subsequent silicon layer. The patterned raising layer 26 covers a top surface and a lateral surface of the gate electrode 23. For example, a non-conductive material is deposited on the gate electrode 23 and the buffer layer 22, and then the deposited non-conductive material is patterned to form the patterned raising layer 26.

The pattern on the patterned raising layer 26 is transferred through a mask pattern transfer process. For example, an entire layer of photoresist is firstly deposited on an unpatterned non-conductive material, then the photoresist is exposed by the mask, and the mask pattern is transferred to the photoresist firstly. Then, the etching process is used to etch the non-conductive material, which is not protected by the photoresist, so that the mask pattern (the same with the pattern of the subsequent transistor channel) is transferred to the non-conductive material. Because the patterned raising layer 26 and the subsequent silicon layer have the same pattern (like the patterned area 25a in FIG. 3G), they can share the same one mask.

The patterned raising layer 26 may be formed from $SiN_x$, $SiO_x$ or $SiO_xN_y$ etc. The patterned raising layer 26 can be deposited by CVD (chemical vapor deposition) or sputtering.

Figure 3D:
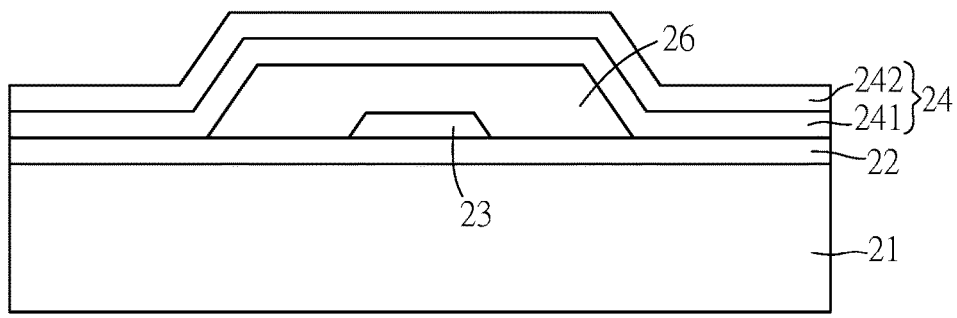

As shown in FIG. 3D, a first diffusion barrier layer 241 is formed on the patterned raising layer 26 and the buffer layer 22, and then a second diffusion barrier layer 242 is formed on the first diffusion barrier layer 241. The first diffusion barrier layer 241 can be deposited by CVD (chemical vapor deposition) or sputtering. The first diffusion barrier layer 241 may be formed from $SiN_x$, $SiO_x$ or $SiO_xN_y$ etc.

Before depositing the second diffusion barrier layer 242, a surface of the first diffusion barrier layer 241 can be roughened. For example, the surface of the first diffusion barrier layer 241 is applied with corrosive plasma (NF3 or SF6 gas), so the coarseness of the first diffusion barrier layer 241 is increased and defects are generated on the upper surface of the first diffusion barrier layer 241. These defects can trap impurity atoms diffusing from the substrate 21 resulting from heating, and prevent the impurity atoms from diffusing upward into the polysilicon layer. Then, the second diffusion barrier layer 242 is deposited, so the diffusion barrier structure 24 has two layers of the diffusion barrier layers.

Figure 3E:
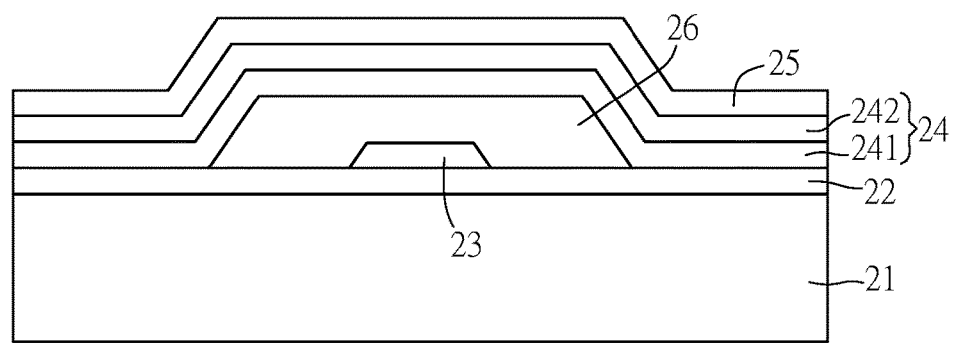

As shown in FIG. 3E, a silicon layer 25 is formed on the second diffusion barrier layer 242. The silicon layer 25 may be deposited on the second diffusion barrier layer 242 by using conventional deposition method. The material of the silicon layer 25 is amorphous silicon.

Figure 3F:
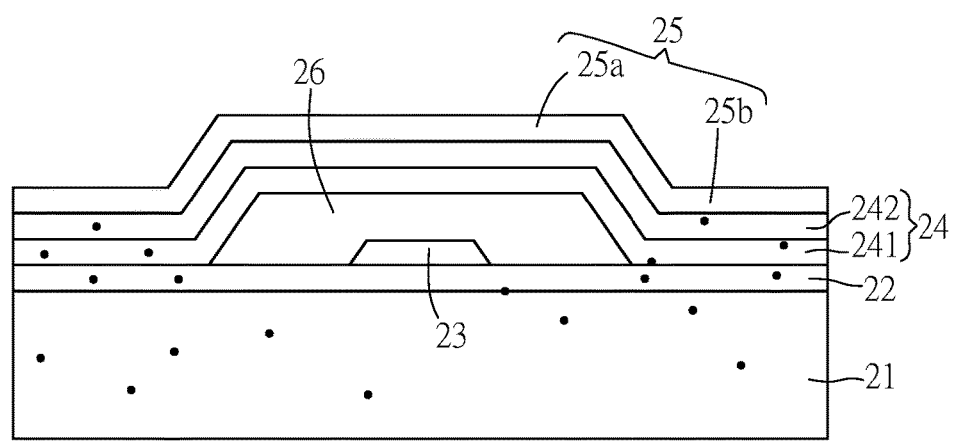

As shown in FIG. 3F, the annealing is performed on the silicon layer 25 to form the polysilicon layer 25. The polysilicon layer 25 includes a patterned area 25a and a to-be-removed area 25b (hereinafter area 25b). The area 25b is outside the patterned area 25a. The patterned area 25a has the same pattern with the patterned raising layer 26. The patterned area 25a is whole directly above the patterned raising layer 26.

In comparison with the area 25b, the patterned area 25a is more distant to the substrate 21, the area 25b is closer to the substrate 21. By the patterned raising layer 26, the patterned area 25a kept in the device is raised and the to-be-removed area 25b of the silicon layer 25 is kept closer to the substrate 21. Because the concentration of the impurity from the substrate 21 decreases depending on distance, most impurities from the substrate 21 will be accumulated at the area 25b which is closer to the substrate 21. Thus, in the patterned area 25a, the concentration of impurity from the substrate 21 is lower than that in area 25b. In the area 25b, most impurities from the substrate 21 are accumulated. As a result, few substrate impurities are accumulated in the patterned area 25a kept in the device. In addition, the patterned raising layer 26 also can block impurities from the substrate 21.

Figure 3G:
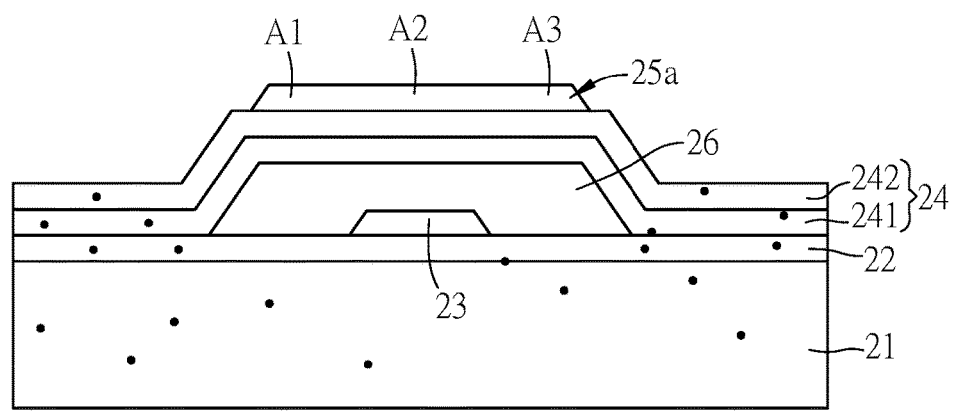

As shown in FIG. 3G the to-be-removed area 25b in the polysilicon layer 25 is removed, and the patterned area 25a is kept. The patterned area 25a includes a center part A2 and two side parts A1, A3. The center part A2 is between the side parts A1, A3, and the center part A2 is directly above the gate electrode 23. The side parts A1, A3 are not directly above the gate electrode 23. The patterned area 25a includes at least a channel. In a thin film transistor, the patterned area 25a further includes a drain and a source. For example, the center part of the patterned area 25a is the cannel, the side parts of the patterned area 25a are the drain and the source. Because the manufacturing and structure of the polysilicon layer 25 are similar to those of the polysilicon layer 13, detailed descriptions thereof will be omitted.

After forming the polysilicon layer 25, the subsequent process may also be performed to form the thin film transistor. A method of manufacturing a low temperature polysilicon thin film transistor includes: the above steps of manufacturing a low temperature polysilicon thin film; forming a source electrode and a drain electrode. The source electrode and the drain electrode are electrically connected to the polysilicon thin film.

In addition, the low temperature polysilicon thin film transistor is not limited to the use in a liquid crystal display panel or an organic light emitter diode panel.

Moreover, in FIG. 3B, the manufacturing method can further include: generating defects on the upper surface of the buffer layer 22. For example, before depositing the first diffusion barrier layer 241, a surface of the buffer layer 22 can be roughened. The surface of the buffer layer 22 is applied with corrosive plasma (NF3 or SF6 gas), so the coarseness of the buffer layer 22 is increased and defects are generated on the upper surface of the buffer layer 22. These defects can trap impurity atoms diffusing from the substrate 21 resulting from heating, and prevent the impurity atoms from diffusing upward into the polysilicon layer. Then, the first diffusion barrier layer 241 is deposited, so the diffusion barrier structure has three layers of the diffusion barrier layers, namely the buffer layer 22, the first diffusion barrier layer 241 and the second diffusion barrier layer 242. Further, roughening the surface of the buffer layer 22 can be done before forming the gate electrode 23.

Besides, in FIG. 3C, the manufacturing method can further include: before forming the second diffusion barrier layer 242, forming an impurity collection layer on the first diffusion barrier layer 241, and then forming the second diffusion barrier layer 242 on the impurity collection layer. For example, the impurity collection layer is low density porous $SiO_x$ layer, and its aperture is smaller than 20 nm.

The material of the trap layer is, for example, the material such as $SiN_x$, $SiO_x$ or $SiO_xN_y$, or the like. For example, the trap layer may be achieved by adjusting the process parameters. For example, the low-density $SiO_x$ film layer may be formed by adjusting the ratio of reactants $SiH_4$ to $N_2O$ or the ratio of reactants TEOS to $O_2$ or $O_3$. In general, the proportion of $SiH_4$ is larger, the porous nature of the $SiO_x$ film layer is increasing; and if the proportion of gas gets smaller, the density of the $SiO_x$ film layer gets smaller.

In summary, bottom gate configuration is utilized in the method of manufacturing a low temperature polysilicon thin film, and multiple diffusion barrier layers are utilized in the gate insulation layer above the gate electrode. Thus, the gate electrode can block the substrate impurities from diffusing into the silicon layer, and the multiple diffusion barrier layers also block the substrate impurities from diffusing into the silicon layer. The polysilicon film can have acceptable semiconductor characteristic.

The polysilicon film has different distances to the substrate. The patterned area (as the channel) is more distant to the substrate, and the other area is closer to the substrate. Thus, the substrate impurities will be blocked by the gate electrode and accumulated in the other area. Fewer substrate impurities will be accumulated in the patterned area. Besides, the patterned raising layer also blocks the impurities, so it helps the decrease of the concentration of substrate impurity in the patterned area.

Moreover, the second diffusion barrier layer 242 can leave pores for the recrystallization protrusions like the buffer layer 12 in the previous embodiment. Thus, at least the protrusions on the lower surface of the polysilicon layer 25 may be filled into the pores. Because relevant explanation can be referred to the previous descriptions, detailed descriptions thereof will be omitted.

Figure 4A:
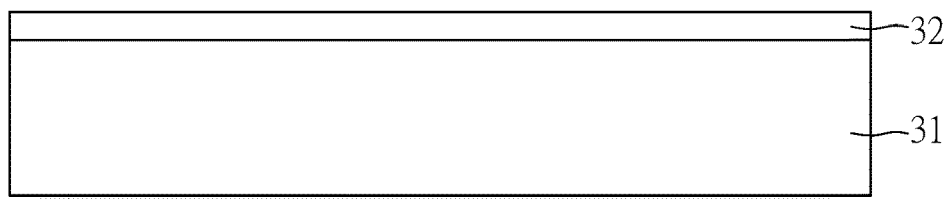
FIGS. 4A to 4E are schematic views showing an embodiment of method of manufacturing a low temperature polysilicon thin film.

FIGS. 4A to 4D are schematic views showing an embodiment of method of manufacturing a low temperature polysilicon thin film. As shown in FIG. 4A, the method of manufacturing a low temperature polysilicon thin film includes providing a substrate 31. For example, the substrate 31 is a transparent insulation substrate which may be formed from glass, quartz, or similar materials. Then, a buffer layer 32 is formed on the substrate 31. The buffer layer 32 can be deposited by CVD (chemical vapor deposition) or sputtering. The buffer layer 32 may be formed from $SiN_x$, $SiO_x$ or $SiO_xN_y$ etc.

Figure 4B:
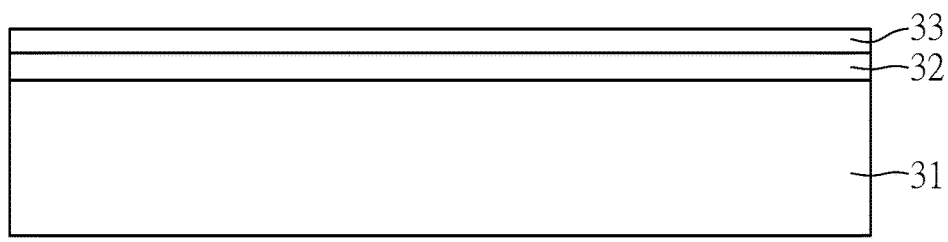
Figure 4C:
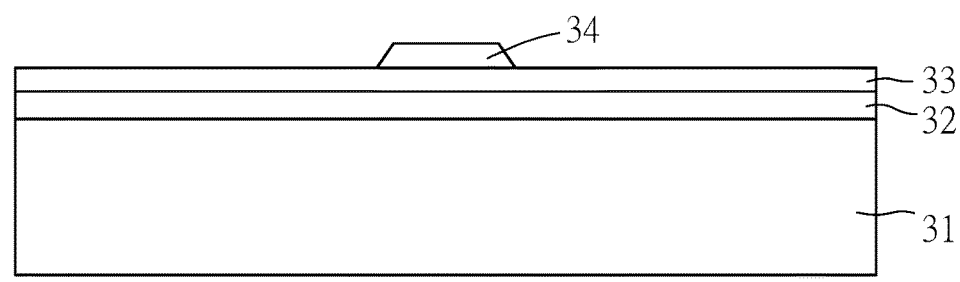

As shown in FIG. 4B, a silicon layer 33 is formed on the buffer layer 32. The silicon layer 33 may be deposited on the buffer layer 32 by using conventional deposition method. The material of the first silicon layer is amorphous silicon As shown in FIG. 4C, an impurity collection layer 34 is formed on the silicon layer 33. The impurity collection layer 34 has porous to trap the impurities from the substrate 31.

The impurity collection layer 33 is a low density porous $SiO_x$ layer, and its aperture is smaller than 20 nm. The material of the trap layer is, for example, the material such as $SiN_x$, $SiO_x$ or $SiO_xN_y$, or the like. For example, the trap layer may be achieved by adjusting the process parameters. For example, the low-density $SiO_x$ film layer may be formed by adjusting the ratio of reactants $SiH_4$ to $N_2O$ or the ratio of reactants TEOS to $O_2$ or $O_3$. In general, the proportion of $SiH_4$ is larger, the porous nature of the $SiO_x$ film layer is increasing; and if the proportion of gas gets smaller, the density of the $SiO_x$ film layer gets smaller.

The material of the impurity collection layer 33 may be photoresist. In comparison with the low density porous $SiO_x$ layer, it is easier to form the impurity collection layer 33 by photoresist.

In FIG. 4C, the manufacturing method define a pattern on the impurity collection layer 34 by the mask pattern transfer process. This pattern can be the same with the gate electrode. If the thin film transistor is top gate structure, the gate electrode will be formed in later process. Because the impurity collection layer 34 and the subsequent gate electrode have the same pattern, they can share the same mask. The material of the impurity collection layer 33 may be photoresist. In comparison with the low density porous $SiO_x$ layer, it is easier to form the impurity collection layer 33 by photoresist.

Figure 4D:
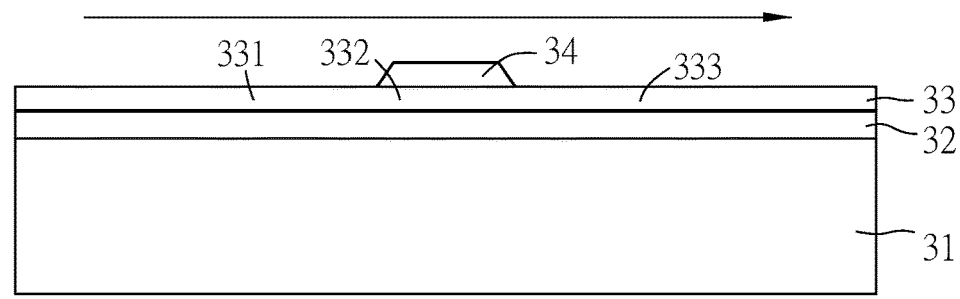

As shown in FIG. 4D, the impurity collection layer 34 is kept on the silicon layer 33. The annealing is performed by laser beam irradiating the silicon layer 33 to form the polysilicon layer 33. In FIG. 4D, the irradiation of laser beam moves along the arrow shown in the figure which traverses the impurity collection layer 34 from one side of the impurity collection layer 34 to the other side of the impurity collection layer 34.

Figure 4E:
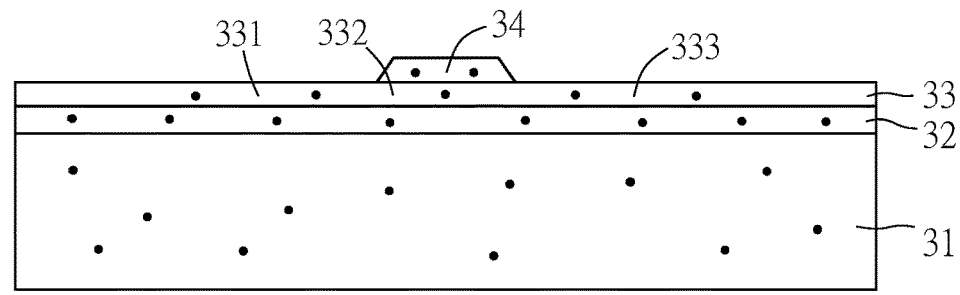

As shown in FIG. 4E, the impurities from the substrate 31 will stay in the silicon layer 33 after temperature decreases. In the laser annealing, the portions 331, 333 of the silicon layer 33 are not covered by the impurity collection layer 34 and lost heat faster. The portion 332 of the silicon layer 33 below the impurity collection layer 34 lost heat slower due to the warmness of the impurity collection layer 34. Thus, times for the impurities from the substrate 31 to stay in the silicon layer 33 are different. Staying in the portions 331, 333 of the silicon layer 33 which are not covered by the impurity collection layer 34 needs shorter time, and staying in the portion 332 of the silicon layer 33 below the impurity collection layer 34 needs longer time.

By the moving direction of the irradiation of the laser beam traversing the impurity collection layer 34 in FIG. 4D, the impurities from the glass stay in the portion 331 of the silicon layer 33 at one side of the impurity collection layer 34 as early as possible, and the impurities in the portion 331 will not diffuse into the portion 332 as many as possible. When the portion 332 is irradiated by the laser beam, the impurities from the substrate 31 can diffuse into the impurity collection layer 34 so the portion 332 has lower impurity concertation then the portion 331. After the portion 333 is irradiated by the laser beam, the impurities staying in the portion 333 will not diffuse into the portion 332 as many as possible because the portion 333 lost heat faster than the portion 332.

In addition, the portions 331, 333 of the polysilicon layer 33 at two sides of the impurity collection layer 34 can be the source and the drain of the thin film transistor. The portion of the polysilicon layer 33 below the impurity collection layer 34 can be the channel of the thin film transistor.

Because the polysilicon layer 33 is similar to the polysilicon layer 13, detailed descriptions thereof will be omitted.

After forming the polysilicon layer 33, the subsequent process may also be performed, as shown in FIG. 1E, to form the thin film transistor. The method of manufacturing a transistor may refer to the relevant description of FIG. 1E, and detailed descriptions thereof will be omitted.

In addition, the low temperature polysilicon thin film transistor is not limited to the use in a liquid crystal display panel or an organic light emitter diode panel.

Besides, the impurity collection layer 34 in FIG. 4C can have porous for recrystallization growth spaces. Its explanation can be referred to the previous description, so detailed descriptions thereof will be omitted.

In summary, in the method of manufacturing the low temperature polysilicon thin film transistor, an impurity collection layer is formed on the silicon layer before annealing. In annealing, the substrate impurities also diffuse into the impurity collection layer, so not all impurities stay in the polysilicon layer and some impurities stay in the impurity collection layer. Thus, the amount of impurity in the polysilicon layer is reduced, and the polysilicon film can have acceptable semiconductor characteristic.

Figure 5A:
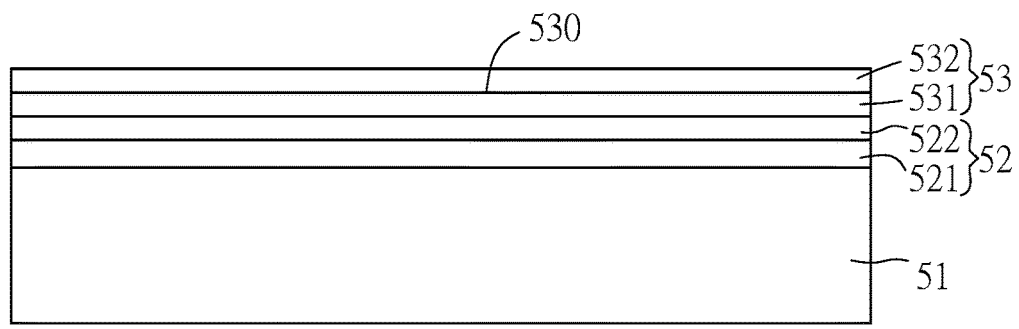
FIGS. 5A to 5C are schematic views showing an embodiment of method of manufacturing a low temperature polysilicon thin film.
Figure 5B:
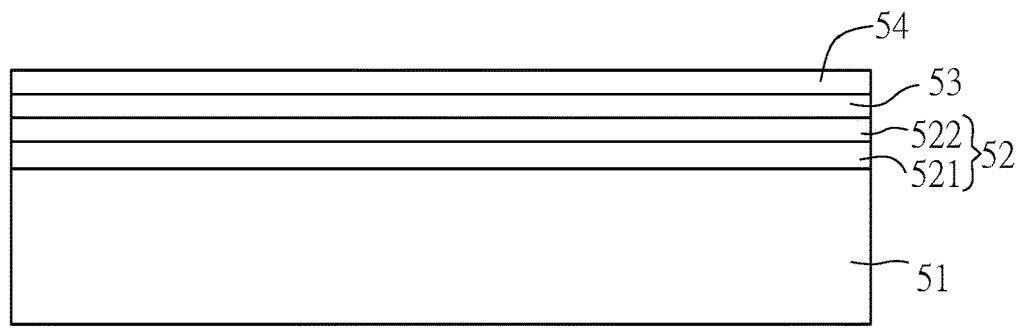
Figure 5C:
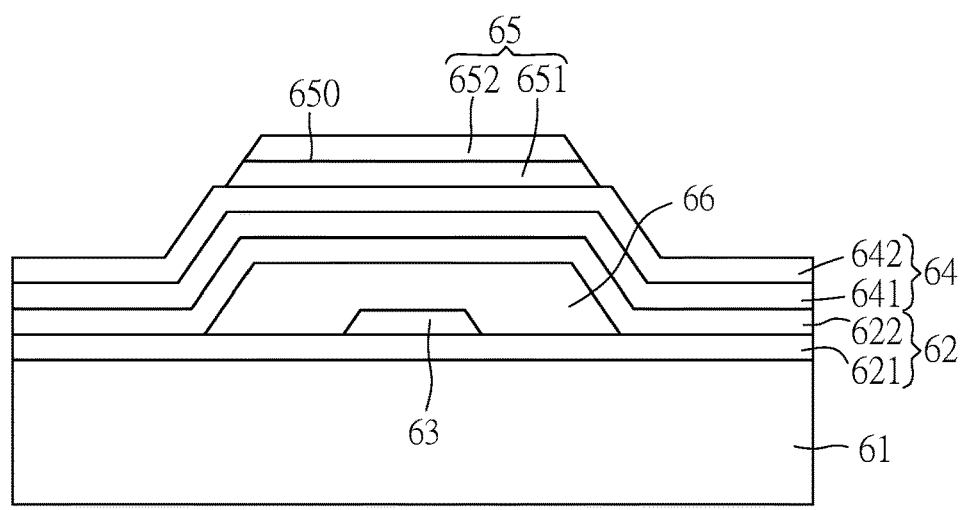

FIGS. 5A to 5C are schematic views showing an embodiment of method of manufacturing a low temperature polysilicon thin film.

As shown in FIG. 5A, the buffer layer 52 includes multiple layers. For example, the buffer layer 52 includes multiple sub-buffer layers 521, 522. In this embodiment, there are two sub-buffer layers, but the amount of the sub-buffer layers is not limited to 2 and can be more.

For example, the uppermost one of the sub-buffer layers 521, 522 can have pores, and the pores may function as the space for recrystallization of the silicon layer.

The buffer layer 52 includes a first sub-buffer layer 521 and a second sub-buffer layer 522. The step of forming the buffer layer 52 includes: forming the first sub-buffer layer 521 on a substrate 51, and then forming the second sub-buffer layer 522 on the first sub-buffer layer 521.

These sub-buffer layers may have different meticulous degrees, the uppermost sub-buffer layer in the buffer layer 52 may have a lower meticulous degree, thereby forming the pores on the upper surface of the uppermost sub-buffer layer to function as the space required by the recrystallization of the silicon layer. For example, the meticulous degree of the second sub-buffer layer 522 is lower than that of the first sub-buffer layer 521. Therefore, the upper surface the second sub-buffer layer 522 has a plurality of pores, and the pores may function as the space for subsequent recrystallization of the silicon layer.

In addition, before forming the silicon layer on the buffer layer, the manufacturing method may roughen the second sub-buffer layer 522 to form pores on the surface of the buffer layer.

The first sub-buffer layer is a diffusion barrier layer. Because impurities in the substrate 51 may be diffused to other layers in the annealing process, a diffusion barrier layer may block at least a portion of the impurities to prevent the excessive impurities from diffusing to the silicon layer. The first sub-buffer layer has a higher meticulous degree than the second sub-buffer layer to have the better diffusion barrier effect.

In addition, before the second sub-buffer layer 522 is formed, the first sub-buffer layer 521 may be roughened by using the manufacturing method to have the better diffusion barrier effect.

A silicon layer 53 is formed on the second sub-buffer layer 522 of the buffer layer 52. The silicon layer 53 includes a first silicon layer 531 and a second silicon layer 532. At this time, most of the silicon layer 53 is formed on the surface of the second sub-buffer layer 522, and the pores of the second sub-buffer layer 522 still have the space not filled with the material of the first silicon layer 531. The first silicon layer 531 may be deposited on the second sub-buffer layer 522 by using conventional methods, and the material of the silicon layer 53 is an amorphous silicon. Because the explanation of the first silicon layer 531 and the second silicon layer 532 can be referred to those of the first silicon layer 131 and the second silicon layer 132, detailed descriptions thereof will be omitted.

After the first silicon layer 531 and the second silicon layer 532 of amorphous silicon are formed, the annealing is performed on the first silicon layer 531 and the second silicon layer 532 to form a polysilicon layer 53. The pores of the second sub-buffer layer 522 are filled with partial silicon material of the polysilicon layer 53. Because the formation and the structure of the polysilicon layer can be referred to the previous embodiment, detailed descriptions thereof will be omitted.

As shown in FIG. 5B, the buffer layer 52 can have multiple layers. The explanation can be referred to FIG. 5A, so detailed descriptions thereof will be omitted. The silicon layer 53 on the buffer layer 52 can be single layer, but it can have multiple layers like FIG. 1C.

Before the annealing is performed on the silicon layer 53 to form the polysilicon layer, an impurity collection layer 54 is formed on the silicon layer 53. Because the explanation of the impurity collection layer 54 can be referred to the impurity collection layer 34 in FIG. 4C, detailed descriptions thereof will be omitted.

As shown in FIG. 5C, in the bottom gate configuration, a buffer layer 62, a patterned raising layer 66, a gate electrode 63, a diffusion barrier structure 64, a silicon layer 65 are above the substrate 61. The buffer layer 62 is a multiple layer structure, and it includes a first sub-buffer layer 621 and a second sub-buffer layer 622. The diffusion barrier structure 64 includes a first diffusion barrier layer 641 and a second diffusion barrier layer 642. The silicon layer 64 includes a first silicon layer 651 and a second silicon layer 652. Because the explanation of these elements can be referred to the correspond elements in the previous embodiments, detailed descriptions thereof will be omitted.

In addition, in FIG. 1C, the method of manufacturing a low temperature polysilicon thin film can further include: roughening a surface of the second silicon layer 132 to form a recrystallization growth space. Partial silicon material of the polysilicon layer 13 is formed into the recrystallization growth space. The surface of the second silicon layer 132 is roughened by etching the surface of the second silicon layer 132. Due to the provision of more recrystallization growth spaces, the squeeze between the crystals in the recrystallization process can be relieved and the size of the protrusions on the surfaces of the polysilicon layer 13 can be significantly reduced. Such manner can be applied to the silicon layer or the uppermost silicon layer in FIGS. 3D, 4B, 5A and 5C.

In addition, in FIG. 1C, the manufacturing method of the low temperature polysilicon thin film may further include: before annealing the silicon layer 13 of amorphous silicon to form the polysilicon layer, defining a pattern on the silicon layer 13, wherein the pattern is left with recrystallization growth space. The recrystallization growth space is located on the lateral side of the pattern. Due to the provision of more recrystallization growth spaces, the squeeze between the crystals in the recrystallization process can be relieved and the size of the protrusions on the surfaces of the polysilicon layer 13 can be significantly reduced. Such manner can be applied to the silicon layer in FIGS. 3D, 4B, 4C, 5A, 5B and 5C.

In summary, in the methods of manufacturing the low temperature polysilicon thin film and the transistor, the silicon layer is deposited twice so a substrate impurity barrier interface is formed between the first silicon layer and the second silicon layer to block the impurities of the substrate from diffusing into the second silicon layer which is upper layer. In one case, most impurities in the silicon layer diffuse into the first silicon layer which is lower layer. In addition, the second silicon layer is thicker than the first silicon layer, so the whole polysilicon layer still have acceptable semiconductor characteristic even if the first silicon layer contain most impurities.

In summary, bottom gate configuration is utilized in the method of manufacturing a low temperature polysilicon thin film, and multiple diffusion barrier layers are utilized in the gate insulation layer above the gate electrode. Thus, the gate electrode can block the substrate impurities from diffusing into the silicon layer, and the multiple diffusion barrier layers also block the substrate impurities from diffusing into the silicon layer. The polysilicon film can have acceptable semiconductor characteristic.

In summary, in the method of manufacturing the low temperature polysilicon thin film transistor, an impurity collection layer is formed on the silicon layer before annealing. In annealing, the substrate impurities also diffuse into the impurity collection layer, so not all impurities stay in the polysilicon layer and some impurities stay in the impurity collection layer. Thus, the amount of impurity in the polysilicon layer is reduced, and the polysilicon film can have acceptable semiconductor characteristic.

In addition, because the methods of manufacturing the low temperature polysilicon thin film and the transistor provide the amorphous silicon with the recrystallization growth space, the squeeze between the crystals can be eased in the amorphous silicon recrystallization process, and thus the sizes of the protrusions of the surface of the polysilicon layer are significantly smaller. In one case, the aspect ratio of the protrusions is smaller than 0.3 and even smaller than 0.2. Thus, the protruding problem on the surface of the low temperature polysilicon thin film can be improved.

In addition, because the aspect ratios of the protrusions of the surface of the polysilicon layer are smaller than 0.3, the properties of the elements may be more consistent. When such a low temperature polysilicon thin film transistor is employed as a switch or driver of a display panel, the color uniformity of the display panel can be better.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A method of manufacturing a low temperature polysilicon thin film, comprising:
    forming a buffer layer on a substrate;
    forming a gate electrode on the buffer layer;
    forming a patterned raising layer on the gate electrode, wherein the patterned raising layer covers a top surface and a lateral surface of the gate electrode;
    forming a first diffusion barrier layer on the patterned raising layer;
    forming a second diffusion barrier layer on the first diffusion barrier layer;
    forming a silicon layer on the second diffusion barrier layer;
    annealing the silicon layer to form a polysilicon layer, wherein the polysilicon layer includes a patterned area and a to-be-removed area, the patterned area has the same pattern with the patterned raising layer, and the patterned area is whole directly above the patterned raising layer; and
    in the polysilicon layer, removing the to-be-removed area, and keeping the patterned area.

2. The method according to claim 1, further comprising: generating defects on an upper surface of the first diffusion barrier layer.

3. The method according to claim 1, further comprising: generating defects on an upper surface of the buffer layer.

4. The method according to claim 1, further comprising: before forming the second diffusion barrier layer, forming an impurity collection layer on the first diffusion barrier layer and then forming the second diffusion barrier layer on the impurity collection layer.

5. The method according to claim 1, further comprising: before annealing, forming an impurity collection layer on the silicon layer.

6. The method according to claim 5, wherein the impurity collection layer is a low density porous $SiO_x$ layer.

7. The method according to claim 5, wherein pores of the impurity trap functions as a recrystallization growth space.

8. The method according to claim 1, wherein the buffer layer comprises a plurality of sub-buffer layers.

9. The method according to claim 1, wherein the annealing is laser annealing.

10. A method of manufacturing a low temperature polysilicon thin film, comprising:
    forming a buffer layer on a substrate;
    forming a gate electrode on the buffer layer;
    forming a patterned raising layer on the gate electrode, wherein the patterned raising layer covers a top surface and a lateral surface of the gate electrode;
    forming a first diffusion barrier layer on the patterned raising layer;
    forming a second diffusion barrier layer on the first diffusion barrier layer;
    forming a silicon layer on the second diffusion barrier layer;
    forming an impurity collection layer on the silicon layer, wherein the impurity collection layer has pores for impurities diffusing from the substrate;
    keeping the impurity collection layer on the silicon layer and annealing by laser beam irradiating the silicon layer to form a polysilicon layer, wherein the polysilicon layer includes a patterned area and a to-be-removed area, the patterned area has the same pattern with the patterned raising layer, and the patterned area is whole directly above the patterned raising layer; and
    in the polysilicon layer, removing the to-be-removed area, and keeping the patterned area.

11. The method according to claim 10, wherein the impurity collection layer is a photoresist or a low density porous $SiO_x$ layer, its aperture is smaller than 20 nm, and pores of the impurity trap functions as a recrystallization growth space.

12. A method of manufacturing a low temperature polysilicon thin film transistor, comprising the steps of:
   forming a buffer layer on a substrate;
   forming a gate electrode on the buffer layer;
   forming a patterned raising layer on the gate electrode, wherein the patterned raising layer covers a top surface and a lateral surface of the gate electrode;
   forming a first diffusion barrier layer on the patterned raising layer;
   forming a second diffusion barrier layer on the first diffusion barrier layer;
   forming a silicon layer on the second diffusion barrier layer;
   annealing the silicon layer to form a polysilicon layer, wherein the polysilicon layer includes a patterned area and a to-be-removed area, the patterned area has the same pattern with the patterned raising layer, and the patterned area is whole directly above the patterned raising layer;
   in the polysilicon layer, removing the to-be-removed area, and keeping the patterned area; and
   forming a source electrode and a drain electrode, wherein the source electrode and the drain electrode are electrically connected to the polysilicon layer.

13. The method according to claim 12, further comprising:
   generating defects on an upper surface of the first diffusion barrier layer.

14. The method according to claim 12, further comprising:
   generating defects on an upper surface of the buffer layer.

15. The method according to claim 12, further comprising:
   before forming the second diffusion barrier layer, forming an impurity collection layer on the first diffusion barrier layer and then forming the second diffusion barrier layer on the impurity collection layer.

16. The method according to claim 12, further comprising:
   before annealing, forming an impurity collection layer on the silicon layer.

17. The method according to claim 16, wherein the impurity collection layer is a low density porous $SiO_x$ layer.

18. The method according to claim 16, wherein pores of the impurity trap functions as a recrystallization growth space.

19. The method according to claim 12, wherein the buffer layer comprises a plurality of sub-buffer layers.

20. The method according to claim 12, wherein the annealing is laser annealing.

* * * * *